United States Patent [19]

Nakayama

[11] Patent Number: 4,500,617

[45] Date of Patent: Feb. 19, 1985

[54] METHOD FOR PREPARING A LITHOGRAPHIC PRINTING PLATE AND A LIGHT-SENSITIVE MATERIAL USED THEREFOR

[75] Inventor: Takao Nakayama, Shizuoka, Japan

[73] Assignee: Fuji Photo Film Co., Ltd., Kanagawa, Japan

[21] Appl. No.: 471,605

[22] Filed: Mar. 3, 1983

[30] Foreign Application Priority Data

Mar. 3, 1982 [JP] Japan .................................. 57-32214
Mar. 31, 1982 [JP] Japan .................................. 57-51064

[51] Int. Cl.$^3$ ............................................. G03G 13/26
[52] U.S. Cl. ......................................... 430/49; 430/302
[58] Field of Search ............................ 430/49, 54, 302

[56] References Cited

U.S. PATENT DOCUMENTS 2,939,787 6/1960 Giaimo .................................. 430/54
4,229,266 10/1980 Usbeck ................................ 430/158
4,254,196 3/1981 Seeley et al. ......................... 430/49

Primary Examiner—John E. Kittle
Assistant Examiner—John L. Goodrow
Attorney, Agent, or Firm—Sughrue, Mion, Zinn, Macpeak, and Seas

[57] ABSTRACT

A method for preparing a lithographic printing plate and the light-sensitive material for lithographic printing plates are disclosed. The method is comprised of providing a light-sensitive material which is comprised of an aluminum or aluminum alloy support having provided thereon a hydrophilic surface layer of aluminum oxide in an amount of 0.2 to 2.8 g/m$^2$, having provided thereon a light-sensitive layer and a photoconductive insulating layer which may be present in separate layers in this order or combined in a single layer. The material thus-provided is imagewise exposed and then electrophotographically processed in order to form an electrostatic latent image on the photoconductive insulating layer. Development of the electrostatic latent image is then carried out with developer particles which are opaque to light to which the light-sensitive layer is sensitive. The light-sensitive material is then exposed through the developed image and the exposed or unexposed areas of the light-sensitive layer are removed by themselves or in combination with the photoconductive insulating layer. The lithographic printing plate prepared by the exposed method has excellent resolving power and does not cause printing stains.

10 Claims, 4 Drawing Figures

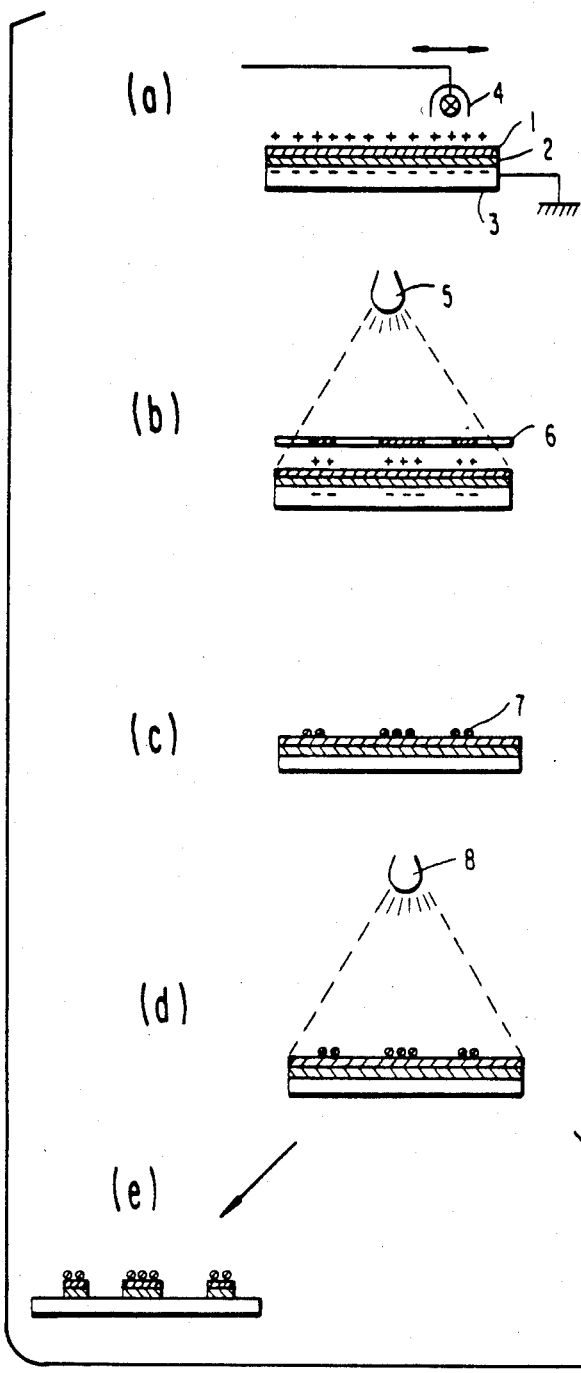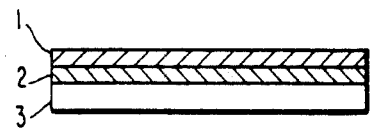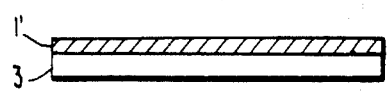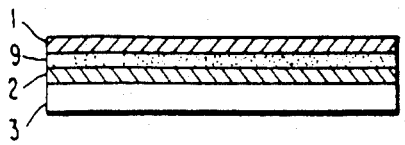

METHOD FOR PREPARING A LITHOGRAPHIC PRINTING PLATE AND A LIGHT-SENSITIVE MATERIAL USED THEREFOR

FIELD OF THE INVENTION

This invention relates to a method for preparing a lithographic printing plate and a light-sensitive material used therefor.

BACKGROUND OF THE INVENTION

Light-sensitive materials having a photoconductive layer which are used for making printing plates by an electrophotographic method are known. For example, light-sensitive materials used for making printing plates comprising a support having provided thereon a metal layer, a photoresist layer and a photoconductive layer have been proposed.

Conventional processes involve complicated steps such as uniformly charging a photoconductive layer, imagewise exposing it to a light to which a photoresist layer is not light-sensitive to prepare an electrostatic latent image on the photoconductive layer, developing the latent image with a toner, fixing or non-fixing a toner image, exposing the photoresist layer under a condition different from that as mentioned above to harden the exposed portion of the photoresist layer, removing the toner image and the photoconductive layer, removing the unhardened portion of the photoresist layer with a solvent, etching a metal layer and removing the photoresist layer remaining on a metal layer. All of these steps are required to prepare a printing plate using the above-mentioned light-sensitive material. Accordingly, the process requires a high degree of skill to prepare a good printing plate. In addition, the resolving power of the plate is not satisfactory since the developing method of the electrostatic latent image formed on a photoconductive layer is a dry method. Furthermore, clearness of a printing image thus-obtained is not satisfactory due to the removal of a photoresist layer and an etching operation of a metal layer.

To eliminate the above defects, European Patent Application, Published No. 0053362 discloses a light-sensitive material which comprises an electroconductive support having a hydrophilic surface, a positive working light-sensitive layer and a photoconductive insulating layer. In accordance with this structure, the positive working light-sensitive layer and the photoconductive insulating layer form a single layer or the former and the latter are provided on the support respectively. The photoconductive insulating layer is substantially capable of being charged negatively or positively and does not prevent the selective removal of the positive working light-sensitive layer. The present inventor also proposed a method for lithographic printing using the above light-sensitive material which comprises (1) a step of forming a latent image electrophotographically on a photoconductive layer of the light-sensitive material, (2) a step of developing the latent image with a liquid developer containing developer particles which are opaque to the light to which the positive working light-sensitive layer is light-sensitive, (3) a step of exposing the positive working light-sensitive layer through the developed image thus-obtained in the step (2), and (4) a step of selectively removing the area of the positive working light-sensitive layer which does not have the developed image. The above method and the light-sensitive material are disclosed and described in European Patent Application, Published No. 0053362.

The above method has advantages over the conventional method with respect to simplification of the steps and further with respect to providing satisfactory resolving power. However, a printing stain is caused when printing is carried out using the printing plate obtained by the above method in which an aluminum support or an aluminum alloy support is used as an electroconductive support.

The present inventor has investigated the cause of the stain and found the following explanation. A photoconductive insulating layer is charged and imagewise exposed to form an electrostatic latent image. The electric charge on the exposed areas is not completely removed. A toner is attached to the exposed areas during development. Where the positive working light-sensitive layer is exposed, unexposed areas remain due to the toner attached to the non-image areas as a fog in step (3). When the light-sensitive layer is selectively removed in step (4), the unexposed areas remain on the support, causing the stain. Further, the inventor has found that the electric charge is not completely removed where the photoconductive insulating layer is exposed due to the presence of aluminum oxide formed by anodic oxidation on the support.

SUMMARY OF THE INVENTION

Lithographic printing plates use an aluminum support which has the surface subjected to graining mechanically or electrolytically and are then anodized to form an aluminum oxide layer to improve the printing durability (or so-called press-life). The aluminum oxide is electrically insulating. Accordingly, the electric charge on exposed areas is prevented from passing through the aluminum support and disappears when a photoconductive insulating layer is imagewise exposed.

As a result of various investigations on the thickness (amount) of aluminum oxide layer formed on the support in view of the above problems, the inventor has achieved the lithographic printing plate having nearly no printing stain (scumming) and having sufficient printing durability by using 0.2 to 2.8 g/m$^2$ of the aluminum oxide layer.

The same investigations were continued on the embodiment using a negative working (negative-positive working) light-sensitive layer in place of the positive working light-sensitive layer and the inventor has also found that a lithographic printing plate having no printing stains (scumming) without affecting the printing durability (press-life) thereof can also be obtained by using 0.2 to 2.8 g/m$^2$ of the aluminum oxide layer formed on the support.

The negative working light-sensitive layer is the type of light-sensitive layer having exposed areas which are insoluble and remain on a support, while the unexposed areas are removed. When the light-sensitive layer having the same compositions as described above is charged and is imagewise exposed, the electric charge on the exposed area of the photoconductive insulating layer partially remains due to the oxidized layer present on a support. Accordingly, toner is attached thereto to form fog during development. When the light-sensitive layer is exposed through a toner image, the fogged areas of the light-sensitive layer are not exposed. Accordingly, these areas are not rendered insoluble. Therefore, when the unexposed areas of the light-sensitive layer are removed, the exposed but soluble areas are removed or are modified which causes pinhole-like non-image areas of the solid black at printing. Therefore, as described above, the printing stain can be prevented by decreasing the amount of the aluminum oxide layer.

Accordingly, an object of this invention is to provide a method for preparing a lithographic printing plate having an excellent resolving power and causing no printing stains.

Another object of this invention is to provide a light-sensitive material used for preparing the above-described lithographic printing plate.

BRIEF DESCRIPTION OF THE DRAWINGS

FIG. 1 is a schematic view of the method of the present invention showing steps a, b, c, d, e and e';

FIGS. 2, 3 and 4 are cross-sectional views of the light-sensitive materials for a lithographic printing plate of the present invention.

DETAILED DESCRIPTION OF THE INVENTION

A method for preparing a lithographic printing plate is disclosed as is the light-sensitive material used therefor. The method comprises electrophotographically treating the light-sensitive material comprising an aluminum support or an aluminum alloy support having a hydrophilic aluminum oxide surface and having coated thereon a light-sensitive layer and a photoconductive insulating layer which form one layer or two layers respectively to form electrostatic latent images on a photoconductive layer; developing the electrostatic latent images with developer particles which do not pass the light which the light-sensitive layer is light-sensitive to; exposing the light-sensitive layer through the thus-obtained developed images; and removing the exposed or unexposed areas of the light-sensitive layer together with the photoconductive insulating layer. In accordance with the present invention, the amount of the aluminum oxide layer forming a hydrophilic surface on a support is 0.2 to 2.8 $g/m^2$.

This invention is utilized in a method which comprises electrophotographically forming a latent image on a photoconductive insulating layer on an aluminum support or an aluminum alloy support, developing with a toner and removing the non-imaged area with an alkaline organic solvent to form a lithographic printing plate. Such a method is disclosed in Japanese Patent Publication Nos. 17162/62, 7758/63 and 39405/71, and Japanese Patent Application (OPI) Nos. 2437/77 and 19063/81 (the term "OPI" as used herein refers to a "publihsed unexamined Japanese patent application"). This invention is particularly effective with a light-sensitive material having a light-sensitive layer which is a mixed layer with an under layer or a photoconductive layer, since the light-sensitive layer itself functions as an insulating layer.

This invention is further explained hereinafter by the accompanying drawings. FIG. 1 is an embodiment of this invention showing the steps of preparing a lithographic printing plate using a positive working light-sensitive layer. In Step (a) of FIG. 1, a light-sensitive material having a positive working light-sensitive layer (2) and a photoconductive insulating layer (1) on an aluminum support or an aluminum alloy support (3) being earthed is used. The support of this invention includes a pure aluminum plate or an aluminum alloy plate, and further includes a plastic film or a paper laminated or vacuum evaporated with an aluminum or an aluminum alloy. (Hereinafter, these various types of support materials will be collectively referred to as an aluminum plate or a support).

The aluminum plate surface is subjected to graining treatment, and is anodized to form a hydrophilic aluminum oxide layer. Conventionally, the amount of the aluminum oxide formed by the anodic oxidation process on an aluminum support for a lithographic printing is about 3 $g/m^2$. The inventor of this invention has found that this amount causes a printing stain and that the amount of the oxide aluminum in a range of from 0.2 to 2.8 $g/m^2$ does not cause the printing stain without affecting the printing durability under the proper conditions of an anodic oxidation such as electric current, voltage, electrolysis temperature, electrolysis time and the concentration of the electrolysis solution.

The surface of the photoconductive insulating layer (1) is charged with a charging device (4). As a charging device, a corotron type device is used. A lamp (5) is imagewise exposed in step (b) to remove the charge of the non-imaged areas on a photoconductive insulating layer (1). If a positive original is used as an original (6), a positive latent image is obtained, and if a negative original is used, a negative latent image is obtained. When using a negative original, reversal development is carried out to obtain a positive image. The light-sensitive plate forming a static latent image is subjected to a liquid development in step (c) to form a toner image (7). The development time can be changed in accordance with the charging electric potential, ζ(zeta)-potential of the toner, development electrode, and the method of development. The development time is normally several seconds to 1 minute to obtain sufficient density so that it can be used as a photo pattern mask of the next step. When reversal development is carried out, if a photoconductive insulating layer is charged negatively, a negatively charged toner is used, and if it is charged positively, a positively charged toner is used. The voltage having the same polarity is applied to the development electrodes. The upper limit of the voltage is the voltage at which the photoconductive insulating layer is charged. The distance between the electrodes should be as short as possible to obtain a good result. Generally, the voltage is 10 to 300 V, the distance between electrodes is 0.5 to 10 mm, and the development time is several seconds to 1 minute.

The developing solution is removed from the light-sensitive plate by a squeeze after development, and the light-sensitive plate is exposed over its entire surface in step (d) by an ultraviolet lamp (8) to render the non-imaged areas of the positive working light-sensitive layer soluble. The light-sensitive plate is dissolved with an alkali solution in step (e) or (e') to remove the non-imaged areas of the light-sensitive layer and thus a lithographic printing plate having a positive image on a support is obtained. In this dissolution step, the remaining areas as a positive image on a support consist of an insoluble positive working light-sensitive layer, a photoconductive insulating layer and a toner layer [(e) in FIG. 1]. A positive image can clearly be read with a toner. The method is particularly advantageous in that when colored images are developed with a toner, the color of which corresponds to that of each of the colored images by a color separation such as cyan, magenta, yellow and black, a multicolored lithographic printing plate can be obtained.

Another embodiment of this invention is a light-sensitive material having a photoconductive insulating layer (1) and a positive working light-sensitive layer (2), and an intermediate layer (9) therebetween. (In FIG. 4). The intermediate layer must be electrically conductive so as to accelerate electric charges having the opposite plating to that of the electric charges on the surface of the photoconductive insulating layer being rapidly maintained on the side of the positive working light-sensitive layer on the aluminum support. This intermediate layer can prevent a photoconductive insulating layer from penetrating into or mixing with the positive working light-sensitive layer. The intermediate layer is a water-soluble resin which is properly electroconductive and insoluble to the positive working light-sensitive layer, and is dissolved and removed in a dissolution step (e') together with a photoconductive insulating layer having a toner image. Thus, a lithographic printing plate with the positive working light-sensitive layer as a lipophilic print surface on a support can be obtained. In the above embodiments, a liquid development is conducted, but a cascade development and a magnetic brush development can also be used.

When an aluminum support having an aluminum oxide layer in an amount of 0.2 to 2.8 g/m² is used in the above-described steps, many printing copies having no printing stains and having a good image quality can be obtained.

A photoconductive insulating layer and a positive working light-sensitive layer can form single layer in this invention. In this case, a homogeneous dispersion obtained by mixing a powder of a photoconductive material, an insulating binding resin and a positive working light-sensitive solution is prepared and coated on a surface of the aluminum oxide formed by an anodic oxidiation having a thickness as defined in this invention after the aluminum support is subjected to graining treatment and drying is conducted.

Generally, the thickness of the photoconductive insulating layer affects on the charging property, light penetration, time of development and resolving power degree. The thickness of the layer is generally 0.5 to 5μ, preferably 1 to 2μ.

The thickness of the intermediate layer is determined by the permeability of the solvent used in the dissolution step (e) or (e') and the resolving power and is generally 0.1 to 5μ, preferably 0.2 to 0.5μ.

The photoconductive material used as a photoconductive insulating layer in this invention includes those that are generally used as a light-sensitive material for electrophotography. It is preferred that the photoconductive material is used as a dispersion dispersed in or a solution dissolved in an insulating binding resin. The photoconductive material is used in this invention which does not absorb the light which the positive working light-sensitive layer residing under the photoconductive insulating layer absorbs.

It is preferred that the photoconductive insulating layer be as thin as possible so that the light penetration amount is large in the light-sensitive material for the lithographic printing in this invention. The photoconductive insulating layer can be positively or negatively charged. The photoconductive material suitable for positive corona discharging includes an inorganic material such as Se, Se-Te and PbO; a low molecular substance such as anthracene, perylene, tetracene, carbazole, tetrabenzyl-p-phenylenediamine, an acylhydrazone derivative, an oxadiazole derivative, a pyrazoline derivative, an imidazolone derivative, an imidazothion derivative, a benzimidazole derivative, a benzoxazole derivative, and a benzthiazole derivative; an organic pigment such as indigo, metal free phthalocyanine, metal phthalocyanine, squarium, dimethyl peryllimido; and an organic high molecular substance such as poly-N-vinylcarbazole, polyacenaphthylene, polyvinyl anthracene, polyvinyl pyrene, polyvinyltetracene and polyvinyl perillene.

The photoconductive material suitable for negative corona charging includes an inorganic material such as ZnO, CdS and TiO₂; a lower molecular substance such as trinitrofluorenone, tetranitrofluorenone, dinitroanthracene and tetracyanopyrene; an organic pigment such as chlorodiane blue; and a complex of poly-N-vinylcarbazole and 2,4,7-trinitrofluorenone. The photoconductive material suitable for negative and positive corona charging can be the combination of the above described organic substances and the binding resin and particularly those that are practically high sensitive are metal free phthalocyanine, metal phthalocyanine, an oxadiazole derivative and a pyrazoline derivative. A light-sensitive material containing a charge generator and a charge transfer and a copolymer of an alkali-soluble resin and a photoconductive substance such as carbazole can also be used.

It is preferred that the photoconductive insulating layer contains an alkali-soluble resin, because the photoconductive insulating layer does not prevent the selective removal of the positive working light-sensitive layer in the step of (e) and (e'), namely, the non-imaged areas of the photoconductive insulating layer are dissolved and removed together with the non-imaged areas of the positive working light-sensitive layer. The alkali-soluble resin is preferably an insulating resin capable of forming a film and is useful as a binding agent for the high molecular weight organic photoconductive substance or as a solvent for the low molecular weight organic photoconductive substance. The resin includes a synthetic resin such as phenol-formaldehyde resin, methacresol formaldehyde resin, styrene-maleic anhydride copolymer, polyacrylic acid-polyacrylic acid amide copolymer, fumaric acid-ethylene glycol copolymer, methyl vinyl ether-maleic anhydride copolymer, acryloyl glycine-vinyl acetate copolymer, polyvinyl pyrrolidone, polyvinyl alcohol, polyamide, alkali-soluble azide resin and halogenated polystyrene and a natural resin such as shellac, protein and glue.

A binding agent for particles of the photoconductive material used for the photoconductive insulating layer is an insulating resin for improving the charging property of the insulating layer such as polyethylene terephthalate, polyimide, polycarbonate, polyacrylate, polymethylmethacrylate, polyvinylfluoride, polyvinyl chloride, polyvinyl acetate, polystyrene, styrene-butadiene copolymer, polymethacrylate, silicone resin, chlorinated rubber, epoxy resin, pure and modified alkyd resin, polyethylmethacrylate, poly-n-butylmethacrylate, a cellulose acetate, ketone resin, polyethylene, polypropylene, polyacrylonitrile, a rosin derivative, polyvinylidene chloride and nitrocellulose.

The intermediate layer, if necessary, provided between the photoconductive insulating layer and the positive working light-sensitive layer can contain a water-soluble resin having a suitable conductivity such as polyvinyl alcohol, alkylhydroxy alkyl cellulose, polyacrylic acid, polyacrylic acid derivative, polyacrylamide, polyvinyl pyrrolidone, polyvinyl methyl ether or reaction products of maleic anhydride with vinyl compound or acrylic compound.

A positive working light-sensitive layer can be prepared by dissolving a light-soluble substance, e.g., an o-quinonediazide compound or a depolymerizable light-sensitive resin alone or in combination with an alkali-soluble resin in a proper solvent and coating it on an electroconductive support. An alkali-soluble resin includes those as described above used for the photoconductive insulating layer and is included in an amount of about 50 to 85 wt% of the light-sensitive layer. Conventionally known plasticizers such as dioctyl phthalate can be incorporated in an amount of not more than 5 wt% in the light-sensitive layer to give flexibility. This positive working light-sensitive layer is coated in an amount of about 0.5 to 7 g/m$^2$ on an aluminum support.

The mixing ratio of the photoconductive material, the insulating resin and an alkali-soluble resin in the photoconductive insulating layer is determined by the photoconductivity, the charging property, the light penetration, the dissolving and permeating speed of the developing solution. Good characteristics are obtained when the mixing ratio is 5 to 30 wt% of the photoconductive material, 0 to 30 wt% of the insulating resin and 50 to 85 wt% of the alkali-soluble resin. When an alkali-soluble resin having low resistance is used, the charging property is improved by the insulating resin, and when an alkali-soluble resin having high resistance is used, the insulating resin may not be present. When a photoconductive insulating layer and a positive working light-sensitiev layer form single layer, the mixing ratio is 5 to 30 wt% of the photoconductive material, 0 to 30 wt% of the insulating resin and 50 to 85 wt% of a light-soluble substance(s).

The liquid developer preferably used in step (c) of the liquid development of this invention is a well-known carbon black dispersed in gasoline, kerosene and carbon tetrachloride which contains alkyd resin and a linseed oil to retain the electric characteristic uniformly, as disclosed in Japanese Patent Publication No. 13424/60. Both negatively and positively charged toners can be used. The negatively charged toners include carbon black, lead chromate and charcoal dispersed in an aliphatic hydrocarbon, gasoline, cyclohexane, pentane and CCl$_4$ and containing a linseed oil, polyethylene and shellac as a controlling agent. The positively charged toners include carbon black, phthalocyanine blue, charcoal and vermilion red dispersed in an aliphatic hydrocarbon, kerosene, cyclohexane, pentane and CCl$_4$ containing alkyd resin, versamide and tergitol as a controlling agent. Developer particles not larger than 1μ are suitable for obtaining an image with a high degree of resolution.

The alkali solution used for dissolving and removing the exposed areas of the positive working light-sensitive layer in step (e) or (e') of this invention includes an aqueous solution of an inorganic alkaine substance such as sodium silicate, potassium silicate, sodium hydroxide, potassium hydroxide, lithium hydroxide, sodium phosphate, sodium secondary phosphate, ammonium phosphate, ammonium secondary phosphate, sodium metasilicate, sodium bicarbonate, and aqueous ammonia. The concentration thereof is about 0.1 to about 10 wt%, preferably about 0.5 to about 5 wt%. The pH of the alkali solution is 12.5 to 13.3, which is suitable for developing the positive working light-sensitive material. A surface active agent and an organic solvent can be incorporated in the alkali solution, if desired and necessary.

This invention has been explained regarding the positive working light-sensitive layer as above, but the invention is also used regarding the negative working light-sensitive layer.

In the embodiment of this invention shown in FIG. 1, a photoconductive layer 1 and a negative working light-sensitive layer 2 comprised of a diazo compound or a diazo resin are provided on an aluminum support 3. The same steps as in the case of the positive working light-sensitive layer are repeated regarding the charging, image-exposure, a toner development and a whole exposure with an ultraviolet ray. With the negative working light-sensitive layer, when the ultraviolet radiation is carried out, the non-imaged areas of the light-sensitive layer where a toner is not present are hardened or made insoluble, and the unexposed areas where a toner is present are removed, while the exposed areas of the light-sensitive layer remain on a support. In this case, the photoconductive layer residing on a light-sensitive layer must be removed. Accordingly, a lithographic printing plate having a hydrophobic positive image formed in the light-sensitive layer can be obtained.

The other materials and processing conditions are entirely the same with regard to the positive working light-sensitive layer. When using the negative working light-sensitive layer, reversal development is not necessary to obtain a positive image from a negative image.

The composition of the negative working light-sensitive layer is a diazo compound or a diazo resin alone as disclosed in U.S. Pat. No. 2,714,066 and a mixture of a diazo compound or a diazo with a binder, as disclosed in U.S. Pat. No. 2,826,501 and British Pat. No. 1,074,392.

The diazo compound includes diazonium salt and a diazo resin as a condensation product of p-diazodiphenylamine and formaldehyde.

Preferred diazo compounds are a compound having not less than 2 diazo groups in one molecule such as a condensation product of a formaldehyde with a salt of p-diazodiphenylamine such as a phenol salt, fluorocaprilate, and a salt of sulfonic acid such as triisopropylnaphthalene sulfonic acid, 4,4'-biphenyldisulfonic acid, 5-nitroorthotoluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-chloro-5-nitrobenzene sulfonic acid, 2-fluorocaprilnaphthalene sulfonic acid, 1-naphthol-5-sulfonic acid, 2-methoxy-4-hydroxy-5-benzoylbenzene sulfonic acid and para-toluenesulfonic acid. Particularly preferred diazo compounds are a condensation product of 2,5-dimethoxy-o-4-p-tolylmercaptobenzene diazonium and formaldehyde including the above salts, a condensation product of 2,5-dimethoxy-4-morpholinobenzene diazonium and formaldehyde or acetoaldehyde and the compound as disclosed in Japanese Patent Application (OPI) No. 33907/73. Those compounds disclosed in U.S. Pat. No. 2,649,373 can also be preferred.

The most preferred diazo compound is a 2-methoxy-4-hydroxy-5-benzoylbenzene sulfonate of a condensation product of p-diazodiphenylamine with formaldehyde.

The binder used together with a diazo compound includes 2-hydroxyethyl methacrylate copolymer as disclosed in British Pat. No. 1,460,978 and U.S. Pat. No. 4,123,276, a copolymer of a monomer having an aromatic hydroxyl group as disclosed in Japanese Patent Application (OPI) No. 98614/79, β-hydroxyethyl-(meth)acrylate polymer and a copolymer having more than 50% of β-hydroxyethyl(meth)acrylate, polymer of the above (meth)acrylate, a copolymer a part of which is substituted with a low molecular polyurethane resin having a hydrophilic ether group as disclosed in Japanese Patent Publication No. 9697/81.

Photopolymerizable compositions having negative properties are described below. A photopolymerizable composition comprises a binder, an addition-polymerizable, unsaturated monomer, and a photopolymerization initiator. Useful binders for the photopolymerizable composition include a methyl acrylate or methacrylate/acrylic or methacrylic acid copolymer, a half ester or half amide of styrene/maleic anhydride copolymer, a benzyl acrylate or methacrylate/acrylic or methacrylic acid copolymer, a benzyl acrylate or methacrylate/itaconic acid copolymer, styrene/itaconic acid copolymer, a vinyl acetate/crotonic acid copolymer, acid cellulose phthalate, an acrylic or methacrylic acid/styrene/alkyl acrylate or a methacrylate copolymer.

Useful unsaturated monomers have at least one addition-polymerizable unsaturated group. Particularly preferable examples thereof are ethylene glycol diacrylate or dimethacrylate, polyethylene glycol diacrylate or dimethacrylate, trimethylolethane triacrylate or methacrylate, trimethylolpropane triacrylate or methacrylate, neopentyl glycol diacrylate or dimethacrylate, pentaerythritol or dipentaerythritol tri-, tetra- or hexa-acrylate or methacrylate, epoxy diacrylate or methacrylate, oligo acrylate as disclosed in Japanese Patent Publication No. 7361/77, acrylurethane resin or acrylurethane oligomer as disclosed in Japanese Patent Publication No. 41708/73, etc.

Useful photopolymerization initiator include vicinal polyketaldonyl compounds disclosed in U.S. Pat. No. 2,367,660, α-carbonyl compounds disclosed in U.S. Pat. Nos. 2,367,661 and 2,367,670, acyloin ethers disclosed in U.S. Pat. No. 2,448,828, aromatic acyloin compounds substituted by α-hydrocarbon disclosed in U.S. Pat. No. 2,722,512, polynuclear quinone compounds disclosed in U.S. Pat. Nos. 3,046,127 and 2,951,758, a combination of triallylimidazole dimer/p-aminophenylketone disclosed in U.S. Pat. No. 3,549,367, benzothiazole type compounds disclosed in Japanese Patent Publication No. 48516/76, benzothiazole type compounds/trihalomethyl-s-triazine type compounds disclosed in Japanese Patent Application (OPI) No. 74887/79, and acridine and phenazine compounds disclosed in U.S. Pat. No. 3,751,259.

In addition to the above-described materials, addition of a thermal polymerization inhibitor is preferable. For example, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole, etc. are useful. In some cases, dyes, pigments or, as printing-out agents, pH indicators may be added.

The light-sensitive layer is exposed with an ultraviolet ray and the unexposed areas where a toner is present on a photoconductive layer are selectively dissolved out and removed by a developing solution. Though the composition of the developing solution varies depending upon the diazo compound and the binder used, a wetting agent such as a sodium salt of laurylalcohol sulfate (trade name, "Monogen Y-100", manufactured by Daiichi Kogyo Seiyaku Co., Ltd.), ammonium salt of alkyllauryl sodium sulfate, sodium salt of octyl sulfate and lauryl sulfate, sodium xylene sulfonate and a monosodium salt of N,N-dihydroxyethylene glycine, and an alkali aqueous solution containing an inorganic alkali agent and an organic amine compound, are generally used. It is preferable to add small amount of a water-miscible organic solvent, e.g., alcohols such as ethylene glycol monobutyl ether and benzyl alcohol; carboxylic acid esters such as ethyl acetate and butyl acetate; ketones such as methyl isobutyl ketone and alkyl substituted aromatic hydrocarbon such as xylene.

This invention is further explained by reference to the following examples. However, the scope of the invention is not limited to these examples. In the examples, "part" means "parts by weight".

EXAMPLE 1

A 2 S aluminum plate having a thickness of 0.2 mm was immersed in a 10% aqueous solution of sodium phosphate at 80° C. for 3 minutes in order to degrease the plate, after which it was subjected to a sand grain treatment by a nylon brush, and anodized in a 20% sulfuric acid to prepare 8 aluminum plates having 8 variable amounts of an oxidized layer (0, 0.1, 0.2, 1.0, 1.9, 2.8, 3.0 and 3.9 g/m$^2$).

Each of the aluminum plates was coated with the following light-sensitive solution by a whirler and dried at 100° C. for 2 minutes.

|  | parts |
|---|---|
| Ester compound of naphthoquinone-(1,2)diazido-(2)-5-sulfonic acid chloride and poly-p-hydroxystyrene | 0.7 |
| Novolak phenol resin | 2.0 |
| Methyl ethyl ketone | 15 |
| Methyl cellosolve acetate | 25 |

The following light-sensitive dispersion which was dispersed by an ultrasonic wave dispersion device for 5 minutes was coated on the thus-obtained positive working light-sensitive layer by a wire bar and dried at 70° C. for 1 minute to prepare a photoconductive insulating layer (photo-semiconductor layer).

|  | parts |
|---|---|
| Novolak phenol resin (33% in isopropyl alcohol) | 12 |
| Ethylacrylate (62)-methyl-methacrylate (25)-methacrylic acid (13) copolymer (25% in methanol) | 4 |
| Phthalocyanine pigment (Sumika Print GN-O) | 1 |
| Toluene | 25 |

Each of the thus-obtained light-sensitive plates was positively corona charged by a corona charging device set with +6,000 voltage, exposed for 3 seconds with a tungsten lamp having 60 lux through a positive transparency, immersed in a liquid developing solution (MRP-610, manufactured by Ricoh Co., Ltd.) having a negatively charged toner for 20 seconds and was dried to provide a positive toner image. The plate was then wholly exposed for 75 seconds by an A-3 printer (Exposure Device for Presensitized Plate) manufactured by Fuji Photo Film Co., Ltd. and developed for 1 minute in a developing DP-3 solution for presensitized plate manufactured by Fuji Photo Film Co., Ltd. which was diluted by water by 1/7 to obtain a lithographic printing plate having a positive image.

The number of the printed copies was checked and the printing stain was observed and the results thereof are shown in Table 1, using the printing plates having aluminum supports with the 8 different amounts of the oxidized layer respectively.

TABLE 1

| Amount of Oxidized Layer $(g/m^2)$ | Printed Copies (printing durability) $(\times 10^4)$ | Scumming |
| --- | --- | --- |
| 0 | 0.7 | Δ |
| 0.1 | 1.5 | Δ |
| 0.2 | 4.2 | o |
| 1.0 | 8 | o |
| 1.9 | 10 | o |
| 2.8 | 12 | o |
| 3.0 | 13 | Δ |
| 3.9 | 13.5 | x | o: No scumming
Δ: Scumming
x: Considerable scumming

It is clear from the above that when the printing plate with an aluminum support having an oxidized layer on the surface thereof in an amount of 0.2 $g/m^2$ to 2.8 $g/m^2$ is used, printed copies with no scumming and high printing durability can be obtained.

EXAMPLE 2

The aluminum plates prepared in the same manner as in Example 1 having 8 variable amounts of oxidized layer were coated with the following light-sensitive solution by a wire bar, and dried for 5 minutes at 70° C. to obtain a light-sensitive plate having a positive working light-sensitive layer and a photoconductive layer which form one layer.

| | parts |
| --- | --- |
| Novolak phenol resin | 2 |
| Ethylmethacrylate (62)-methylmethacrylate (25)-methacrylic acid (13) copolymer (25% in methanol) | 4 |
| Ester compound of naphthoquinone diazidosulfonic acid and pyrogallol acetone resin | 1.6 |
| Microlith 4G-T (Ciba Geigy) | 1 |
| Methyl ethyl ketone | 20 |
| Methyl cellosolve acetate | 30 |

Each of the thus-obtained light-sensitive plates was processed in the same manner as in Example 1 to prepare a lithographic printing plate. The same observation was made on 8 variable plates and the results of the printing copies (printing durability) and the scumming are shown in Table 2.

TABLE 2

| Amount of Oxidized Layer $(g/m^2)$ | Printed Copies (printing durability) $(\times 10^4)$ | Scumming |
| --- | --- | --- |
| 0 | 0.4 | Δ |
| 0.1 | 0.7 | Δ |
| 0.2 | 3.9 | o |
| 1.0 | 6 | o |
| 1.9 | 9 | o |
| 2.8 | 10 | o |
| 3.0 | 10 | Δ |
| 3.9 | 10 | x |

It is clear from the above that when the printing plate with an aluminum support having 0.2 $g/m^2$ to 2.8 $g/m^2$ oxidized layer is used, printing copies with no scumming and high printing durability can be obtained.

EXAMPLE 3

A 0.24 mm thick, grained aluminum plate was anodized in a sulfuric acid bath to form an oxide film of about 2.7 $g/m^2$. After washing and drying thoroughly, a light-sensitive solution prepared according to the following formulation was coated thereon by means of a whirler to form a light-sensitive layer having a dried coating weight of 1.2 $g/m^2$. Formulation of light-sensitive solution:

| | |
| --- | --- |
| 2-Hydroxyethyl methacrylate copolymer (described in Example 1 in BP 1,505,739) | 0.87 g |
| 2-Methoxy-4-hydroxy-5-benzoylbenzene-sulfonic acid salt of a condensate of p-diazodiphenylamine with paraformaldehyde | 0.1 g |
| 2-Methoxyethanol | 6 g |
| Methanol | 6 g |
| Ethylene dichloride | 6 g |

On the thus formed light-sensitive layer was wire barcoated the following solution having been dispersed for 5 minutes by means of an ultrasonic wave dispersing machine, and dried at 70° C. for 1 minute. The coating amount of solids of the photo-semiconductor layer thus formed was 2.5 $g/m^2$.

| | |
| --- | --- |
| Novolak phenol resin (33% solution in isopropyl alcohol) | 12 g |
| $\{$Ethyl acrylate$_{62}$-methyl methacrylate$_{25}$-methacrylic acid$_{13}\}$ (25% solution in ethyl alcohol) | 4 g |
| Phthalocyanine pigment (Sumika Print GN-O, made by Sumitomo Chemical Co., Ltd.) | 1 g |
| Toluene | 25 g |

This light-sensitive plate was positively corona charged by means of a corona charger whose charging potential was set to +6,000 V, then imagewise exposed for 2 seconds to 60 lux light emitted from a tungsten lamp through a negative transparency. It was then toner-developed for ten seconds in a dark room in a liquid developing solution (MRP-610, made by Ricoh Company Ltd.) retained in a stainless steel trough with the light-struck surface downward to thereby obtain a negative toner image on the light-sensitive plate. The whole surface of the plate was then exposed for 60 seconds by an A3 printer (machine for exposing presensitized plates) made by Fuji Photo Film Co., Ltd., followed by developing the plate for one minute in a solution prepared by diluting a presensitized plate-developing DN-3C (made by Fuji Photo Film Co., Ltd.) to ½ with water to obtain a lithographic printing plate having a positive image. When off set printing was performed using this lithographic printing plate, 40,000 or more distinct prints were obtained.

EXAMPLE 4

On the same aluminum support as used in Example 3 was coated a light-sensitive solution prepared according to the following formulation by using a whirler to obtain a light-sensitive layer having a dried coating weight of 1.7 $g/m^2$.

| | |
|---|---|
| Poly-p-vinylphenol cinnamate | 25 g |
| 5-Nitroacenaphthene | 3 g |
| 2,6-Di(4'-azidobenzal)-4-methyl-cyclohexanone | 1.5 g |
| Methyl ethyl ketone | 200 g |
| Toluene | 30 g |

A photo-semiconductive layer of the following formulation was provided thereon in a dried coating weight of 1.9 g/m$^2$ in the same manner.

| | |
|---|---|
| ${-}$Ethyl acrylate$_{62}$-methyl methacrylate$_{25}$-methacrylic acid$_{13}{-}$ (25% solution in ethyl alcohol) | 12 g |
| Microlith 4G-T (phthalocyanine pigment made by CIBA GEIGY A.G.) | 1.5 g |
| Toluene | 25 g |

This light-sensitive plate was treated in the same manner as in Example 3 to obtain a negative image on the light-sensitive plate. The whole surface of the light-sensitive plate was then exposed for 90 seconds using an A3 printer (a machine for exposing presensitized plates) made by Fuji Photo Film Co., Ltd., dipped for about 40 seconds in a developing solution comprising 20 parts by weight of Na$_2$SiO$_3$.9H$_2$O, 20 parts by weight of benzyl alcohol, 2 parts by weight of sodium hydroxide, 3 parts by weight of an anionic surfactant (30% aqueous solution), and 955 parts by weight of water, washed and dried to obtain a lithographic printing plate having a positive image. When offset printing was performed using this lithographic printing plate, 85,000 or more distinct prints were obtained.

What is claimed is:

1. In a method for preparing a lithographic printing plate using a light-sensitive material comprising an aluminum or aluminum alloy support having a hydrophilic aluminum oxide surface provided thereon, in order, a light-sensitive layer and a photoconductive insulating layer, said method comprising the steps of:
   electrophotographically forming an electrostatic latent image on the photoconductive insulating layer;
   developing the latent image with toners which are opaque to the light to which the light-sensitive layer is sensitive, thereby forming toner image;
   exposing the light-sensitive layer through the toner image; and
   separating the exposed and unexposed areas of the light-sensitive layer;
   wherein said aluminum oxide layer is present in an average amount of from 0.2 to 2.8 g/m$^2$.

2. A method for preparing a lithographic printing plate as claimed in claim 1, wherein the light-sensitive layer and photoconductive insulating layer are present within the same space in a single layer.

3. A method for preparing a lithographic printing plate as claimed in claim 1, wherein the hydrophilic surface layer has provided directly thereon a separate light-sensitive layer which in turn has provided directly thereon a photoconductive insulating layer.

4. A method for preparing a lithographic printing plate as claimed in claim 3, wherein said light-sensitive layer is positive working and the removing is carried out by removing the exposed areas of the light-sensitive layer in combination with the entire photoconductive insulating layer.

5. A method for preparing a lithographic printing plate as claimed in claim 3, wherein said light-sensitive layer is negative working and the removing is carried out by removing the unexposed areas of the light-sensitive layer in combination with the entire photoconductive insulating layer.

6. A method for preparing a lithographic printing plate as claimed in claim 1, wherein the photoconductive insulating layer and the light-sensitive layer are provided in separate layers and are separated by an intermediate layer.

7. A light-sensitive material for a lithographic printing plate, comprising:
   a base support comprised of a material selected from the group consisting of aluminum or aluminum alloy;
   a hydrophilic surface layer of aluminum oxide in an amount of 0.2 to 2.8 g/m$^2$ provided on the surface of the support;
   a light-sensitive layer;
   a photoconductive insulating layer capable of being electrophotographically processed to form electrostatic latent images, and further wherein exposed and unexposed areas of the light-sensitive layer are separable from each other.

8. A light-sensitive material for a lithographic printing plate as claimed in claim 7, wherein the photoconductive insulating layer and the light-sensitive layer are provided in separate layers and are separated by an intermediate layer.

9. A light-sensitive material for a lithographic printing plate as claimed in claim 7, wherein the photoconductive insulating layer has a thickness within the range of 1 to 2$\mu$.

10. A light-sensitive material for a lithographic printing plate as claimed in claim 8, wherein the intermediate layer has a thickness within the range of about 0.2 to about 2.5$\mu$.

* * * * *